(12) United States Patent
Kishimoto (10) Patent No.: US 10,032,922 B2
(45) Date of Patent: Jul. 24, 2018

(54) THIN-FILM TRANSISTOR WITH CRYSTALLIZED ACTIVE LAYER, METHOD OF MANUFACTURING THE SAME, AND ORGANIC LIGHT-EMITTING DISPLAY DEVICE INCLUDING THE SAME

(71) Applicant: SAMSUNG DISPLAY CO., LTD., Yongin-si, Gyeonggi-Do (KR)

(72) Inventor: Katsushi Kishimoto, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 9 days.

(21) Appl. No.: 14/834,581

(22) Filed: Aug. 25, 2015

(65) Prior Publication Data

US 2016/0149053 A1     May 26, 2016

(30) Foreign Application Priority Data

Nov. 21, 2014 (KR) ........................ 10-2014-0163716

(51) Int. Cl.

| H01L 29/04 | (2006.01) |
|---|---|
| H01L 29/10 | (2006.01) |
| H01L 31/00 | (2006.01) |
| H01L 29/786 | (2006.01) |
| H01L 29/66 | (2006.01) |

(52) U.S. Cl.
CPC .. *H01L 29/78675* (2013.01); *H01L 29/66757* (2013.01); *H01L 29/78621* (2013.01)

(58) Field of Classification Search
CPC ......... H01L 29/78675; H01L 29/66757; H01L 29/78621

USPC ....................................................... 257/40, 59
See application file for complete search history.

(56) References Cited

U.S. PATENT DOCUMENTS

| 5,595,944 A | * | 1/1997 | Zhang | ............... | H01L 21/26506 |
|---|---|---|---|---|---|
| | | | | | 257/E21.133 |
| 5,744,824 A | * | 4/1998 | Kousai | .............. | H01L 29/78621 |
| | | | | | 257/64 |
| 6,232,205 B1 | * | 5/2001 | Ohtani | ................ | H01L 21/2022 |
| | | | | | 257/913 |

(Continued)

FOREIGN PATENT DOCUMENTS

| GB | 2326019 A | * | 12/1998 | ....... H01L 29/42384 |
|---|---|---|---|---|
| JP | 01-322100 A | | 12/1989 | |

(Continued)

OTHER PUBLICATIONS

Saraswat, Ph. D Thesis, Stanford University,1987.

(Continued)

*Primary Examiner* — Lex Malsawma
*Assistant Examiner* — Eric W Jones
(74) *Attorney, Agent, or Firm* — Lee & Morse P.C.

(57) ABSTRACT

A thin-film transistor, including a substrate; an active layer on the substrate; a gate electrode on the active layer; and a gate insulating layer between the active layer and the gate electrode, the active layer including a channel region; source and drain regions at opposite sides of the channel region; and lightly doped regions between the channel region and the source region and between the channel region and the drain region, the source and drain regions being doped with a first element, and the lightly doped regions being doped with a second element different from the first element.

20 Claims, 6 Drawing Sheets

(56) References Cited

U.S. PATENT DOCUMENTS

| | | | | |
|---|---|---|---|---|
| 6,362,027 B1* | 3/2002 | Yamazaki | H01L 27/12 | |
| | | | 257/E21.413 | |
| 6,465,288 B1* | 10/2002 | Ohnuma | H01L 21/3221 | |
| | | | 257/E21.133 | |
| 6,680,223 B1* | 1/2004 | Yamazaki | H01L 27/1214 | |
| | | | 257/E21.414 | |
| 6,927,107 B1* | 8/2005 | Makita | H01L 21/2022 | |
| | | | 257/66 | |
| 2003/0003694 A1* | 1/2003 | Voutsas | C23C 14/0682 | |
| | | | 438/478 | |
| 2004/0253771 A1* | 12/2004 | Yamazaki | H01L 27/1237 | |
| | | | 438/149 | |
| 2005/0003594 A1* | 1/2005 | Koezuka | H01L 27/1277 | |
| | | | 438/166 | |
| 2005/0181566 A1* | 8/2005 | Machida | H01L 29/66757 | |
| | | | 438/301 | |
| 2006/0030086 A1 | 2/2006 | Itoh et al. | | |
| 2006/0046360 A1* | 3/2006 | Jung | H01L 21/2022 | |
| | | | 438/149 | |
| 2006/0119949 A1* | 6/2006 | Tanaka | B23K 26/0604 | |
| | | | 359/624 | |
| 2006/0263957 A1* | 11/2006 | Wong | H01L 21/02532 | |
| | | | 438/166 | |
| 2011/0297911 A1* | 12/2011 | Shima | H01L 27/2409 | |
| | | | 257/4 | |
| 2013/0071963 A1* | 3/2013 | Choi | H01L 29/78627 | |
| | | | 438/34 | |
| 2013/0273724 A1* | 10/2013 | Joo | H01L 21/02422 | |
| | | | 438/486 | |
| 2014/0312349 A1* | 10/2014 | Jiang | H01L 29/66757 | |
| | | | 257/66 | |
| 2015/0182995 A1* | 7/2015 | Theodore | H05B 6/6491 | |
| | | | 219/759 | |

FOREIGN PATENT DOCUMENTS

| | | |
|---|---|---|
| JP | 04-226081 A | 8/1992 |
| JP | 2006-049696 A | 2/2006 |
| KR | 10-2011-0054874 A | 5/2011 |
| KR | 10-2013-0117053 A | 10/2013 |

OTHER PUBLICATIONS

Sadoh, et al., "Suppression of Floating Body Effects in Polycrystalline Silicon Thin-Film Transistor by Schottky Source/Drain Structure," Japanese Journal of Applied Physics vol. 45, No. 5B, 2006, pp. 4370-4373.

* cited by examiner

THIN-FILM TRANSISTOR WITH CRYSTALLIZED ACTIVE LAYER, METHOD OF MANUFACTURING THE SAME, AND ORGANIC LIGHT-EMITTING DISPLAY DEVICE INCLUDING THE SAME

CROSS-REFERENCE TO RELATED APPLICATION

Korean Patent Application No. 10-2014-0163716, filed on Nov. 21, 2014, in the Korean Intellectual Property Office, and entitled: "Thin-Film Transistor, Method Of Manufacturing The Same, and Organic Light Emitting Display Device Including The Same," is incorporated by reference herein in its entirety.

BACKGROUND

1. Field

One or more exemplary embodiments relate to a thin-film transistor, a method of manufacturing the same, and an organic light-emitting display device including the same.

2. Description of the Related Art

As organic light-emitting display devices may have self-emitting characteristics, they may not require a separate light source. Organic light-emitting display devices may be driven at a low voltage, may be formed to be lightweight and thin, and may have high-quality characteristics such as wide view angle, good contrast, and quick response time. Organic light-emitting display devices are, accordingly, new generation display devices.

SUMMARY

Embodiments may be realized by providing a thin-film transistor, including a substrate; an active layer on the substrate; a gate electrode on the active layer; and a gate insulating layer between the active layer and the gate electrode, the active layer including a channel region; source and drain regions at opposite sides of the channel region; and lightly doped regions between the channel region and the source region and between the channel region and the drain region, the source and drain regions being doped with a first element, and the lightly doped regions being doped with a second element different from the first element.

A diffusion coefficient of the second element with respect to silicon may be greater than a diffusion coefficient of the first element with respect to silicon.

The source and drain regions may include silicide.

The first element may include one or more of boron (B), titanium (Ti), nickel (Ni), or zinc (Zn).

The second element may include one or more of titanium (Ti), nickel (Ni), or zinc (Zn), iron (Fe), copper (Cu), gold (Au), or silver (Ag).

Side surfaces of the lightly doped regions contacting the channel region may not be perpendicular to a surface of the substrate.

Side surfaces of the lightly doped regions contacting the source and drain regions may be perpendicular to the surface of the substrate, and cross-sectional areas of the lightly doped regions in a direction parallel to the surface of the substrate may gradually decrease in a direction away from the substrate.

The gate electrode may overlap the lightly doped regions.

Embodiments may be realized by providing a method of manufacturing a thin-film transistor, the method including forming one pair of precursor layers and an amorphous silicon layer on a substrate; forming an active layer by crystallizing the amorphous silicon layer; forming a gate insulating layer on the active layer; and forming a gate electrode on the gate insulating layer, the one pair of precursor layers including first and second elements that are different from each other, and forming the active layer including forming a channel region by crystallizing the amorphous silicon layer; forming source and drain regions by diffusing the first element into the amorphous silicon layer; and forming lightly doped regions by diffusing the second element into the amorphous silicon layer.

The second element may be diffused to a wider area than the first element in the amorphous silicon layer, the source and drain regions may be formed at opposite sides of the channel region, and the lightly doped regions may be formed between the channel region and the source region and between the channel region and the drain region.

Forming the one pair of precursor layers may be performed after forming the amorphous silicon layer, and the one pair of precursor layers may be formed on the amorphous silicon layer at locations corresponding to where the source and drain regions are to be formed.

The source and drain regions may include silicide.

Forming the one pair of precursor layers may be performed by a sputtering method using a target including the first and second elements.

An amount of the first element in the target may be greater than an amount of the second element in the target.

Forming the amorphous silicon layer may be performed after forming the one pair of precursor layers, and the amorphous silicon layer may cover the one pair of precursor layers.

Side surfaces of the lightly doped regions contacting the channel region may not be perpendicular to a surface of the substrate, side surfaces of the lightly doped regions contacting the source and drain regions may be perpendicular to the surface of the substrate, and cross-sectional areas of the lightly doped regions in a direction parallel to the surface of the substrate may gradually decrease in a direction away from the substrate.

The gate electrode may overlap the lightly doped regions.

Embodiments may be realized by providing an organic light-emitting display device, including a substrate; a thin-film transistor on the substrate; and an organic light-emitting diode electrically connected to the thin-film transistor, the thin-film transistor including an active layer on the substrate; a gate electrode on the active layer; and a gate insulating layer between the active layer and the gate electrode, the active layer including a channel region; source and drain regions at opposite sides of the channel region; and lightly doped regions between the channel region and the source region and between the channel region and the drain region, the source and drain regions being doped with a first element, and the lightly doped regions being doped with a second element different from the first element.

The source and drain regions may include silicide.

The gate electrode map overlap the lightly doped regions.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Figure 1:
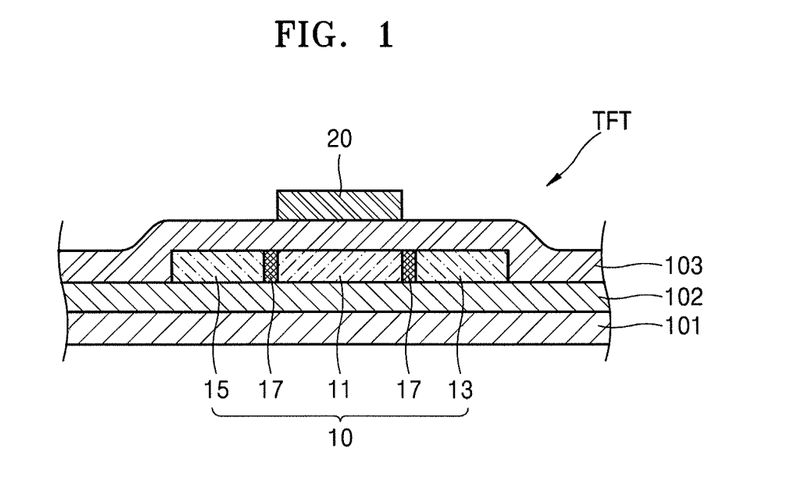
FIG. 1 illustrates a cross-sectional view of a thin-film transistor according to an embodiment.

FIG. 1 illustrates a cross-sectional view of a thin-film transistor TFT according to an embodiment, and FIGS. 2 to 5 illustrate cross-sectional views of a method of manufacturing the thin-film transistor TFT of FIG. 1.

Referring to FIG. 1, the thin-film transistor TFT according to an embodiment may include a substrate 101, an active layer 10 on the substrate 101, a gate insulating layer 103 on the active layer 10, and a gate electrode 20 on the gate insulating layer 103.

The substrate 101 may include a transparent glass material including silicon oxide ($SiO_2$) as a main component. In an embodiment, the substrate 101 may include ceramic, plastic, or stainless use steel (SUS).

A buffer layer 102 may be further provided on the substrate 101 and may planarize the substrate 101 and may block infiltration of impurity elements. The buffer layer 102 may include an inorganic material such as silicon nitride and/or silicon oxide and may be a single-layer or a multilayer.

The active layer 10 may include, for example, polysilicon and may include a channel region 11 and source and drain regions 13 and 15 at opposite sides of the channel region 11. The active layer 10 may include lightly doped regions 17 between the channel region 11 and the source region 13 and between the channel region 11 and the drain region 15.

The source and drain regions 13 and 15 may be formed of silicide doped with a first element. For example, the first element may include one or more of boron (B), titanium (Ti), nickel (Ni), or zinc (Zn). As described above, the source and drain regions 13 and 15 may be formed of silicide, a resistance and a leakage current of the source and drain regions 13 and 15 may be reduced, and a current characteristic of the thin-film transistor TFT may be improved.

The lightly doped regions 17 may be doped with a second element that is different from the first element. The second element may be a material of which a diffusion coefficient in silicon is greater than that of the first element. For example, the second element may include one or more of Ti, Ni, Zn, iron (Fe), copper (Cu), gold (Au), or silver (Ag). The lightly doped regions 17 may form a lightly doped drain (LDD) structure of the thin-film transistor TFT. Even though a width of the channel region 11 may decrease along with the miniaturization of the thin-film transistor TFT, the generation of hot carriers may be restrained to improve a punch-through characteristic occurring, for example, due to a short-channel effect, and the reliability of the thin-film transistor TFT may be improved.

The gate insulating layer 103 may be disposed on the active layer 10, and the gate electrode 20 may be disposed at a location overlapped with, e.g., overlapping, the active layer 10 by interposing the gate insulating layer 103 therebetween.

The gate insulating layer 103 may insulate between the active layer 10 and the gate electrode 20, e.g., may insulate the active layer 10 from the gate electrode 20, and may be formed of an organic material or an inorganic material such as silicon nitride ($SiN_x$) or silicon oxide ($SiO_2$).

The gate electrode 20 may include Au, Ag, Cu, Ni, platinum (Pt), palladium (Pd), aluminum (Al), or molybdenum (Mo) or an alloy such as an Al:neodymium (Nd) alloy or an Mo:tungsten (W) alloy. In an embodiment, the gate electrode 20 may be formed of various materials in consideration of design conditions.

A method of manufacturing the thin-film transistor TFT of FIG. 1 will now be described in brief with reference to FIGS. 2 to 5.

Figure 2:
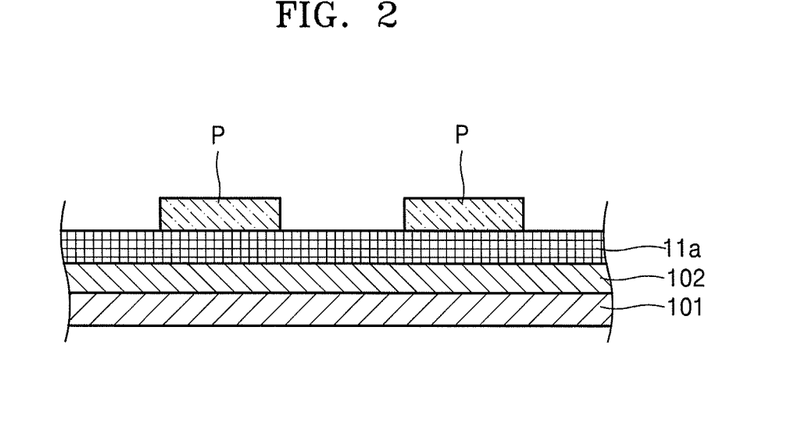
FIGS. 2 to 5 illustrate cross-sectional views of a method of manufacturing the thin-film transistor of FIG. 1.

As shown in FIG. 2, an amorphous silicon layer 11a and one pair of precursor layers P may be formed on the substrate 101 on which the buffer layer 102 is formed. The one pair of precursor layers P may be respectively formed to correspond to locations at which the source and drain regions 13 and 15 are to be formed, e.g., formed at locations corresponding to where the source and drain regions 13 and 15 are to be formed. For example, after the amorphous silicon layer 11a is coated, the one pair of precursor layers P may be formed on amorphous silicon layer 11a.

The one pair of precursor layers P may be formed by a sputtering method. The one pair of precursor layers P in which the first and second elements are mixed may be easily formed and may prevent impurities from being mixed into the one pair of precursor layers P compared with when the one pair of precursor layers P are formed by, for example, a chemical vapor deposition (CVD) method.

A target used for sputtering may include the first and second elements, wherein a contained quantity of the second element may be less than that of the first element. For example, the target may have a composition of Ti-0.01% Cu, Ti-0.5% Zn, $Ti_{0.2}$—$Ni_{0.8}$, or Ni-0.001% Cu.

Figure 3:
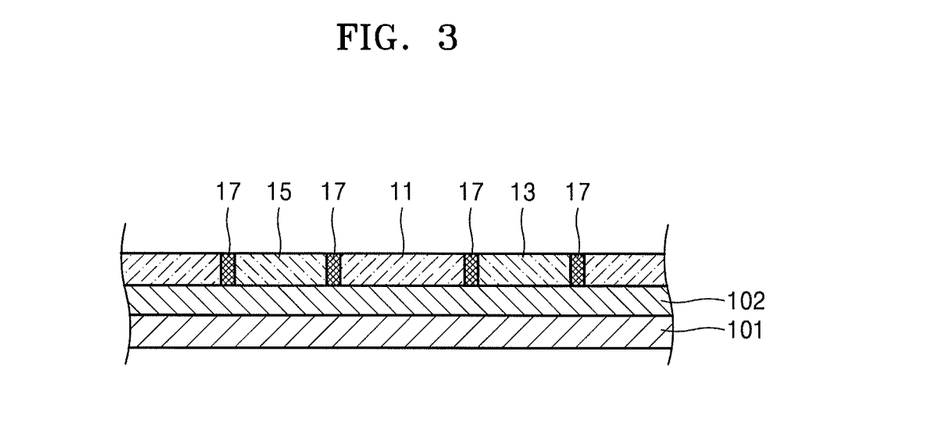

After forming the amorphous silicon layer 11a and the one pair of precursor layers P, as shown in FIG. 3, the amorphous silicon layer 11a may be crystallized. Examples of methods of crystallizing the amorphous silicon layer 11a may include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS). In an embodiment, the RTA method may be used for thermal diffusion of the one pair of precursor layers P.

When the amorphous silicon layer 11a is crystallized by an RTA method, the first and second elements included in the one pair of precursor layers P may be diffused into the amorphous silicon layer 11a, and the source region 13, the drain region 15, and the lightly doped regions 17 may be simultaneously formed.

The second element included in the one pair of precursor layers P may have a greater diffusion coefficient in silicon than the first element included in the one pair of precursor layers P, and the second element may be diffused to a wide area, e.g., to a wider area than the first element. The first element may be mainly included in the source and drain regions 13 and 15, and the lightly doped regions 17 including the second element may be formed at opposite sides of the source and drain regions 13 and 15, respectively. The source and drain regions 13 and 15 formed of silicide and the LDD structure may be simultaneously formed, and a process of manufacturing the thin-film transistor TFT may be simplified.

The source and drain regions 13 and 15 may be formed of silicide including the first element, and the source and drain regions 13 and 15 may be formed by a low-temperature process in which an annealing temperature is lowered to about 500° C. or less. For example, the source and drain regions 13 and 15 may be formed by annealing Ti silicide at 450° C. for 30 minutes, and a resistance of the formed Ti silicide may be about 1600Ω/□. Damage of the substrate 101 by heat during the annealing may be prevented, and the source and drain regions 13 and 15 having a low resistance may be formed.

By forming the one pair of precursor layers P by a sputtering method, the mixture of impurities in the one pair of precursor layers P may be prevented, and the source and drain regions 13 and 15 may include oxygen, nitride, and carbon such that each of oxygen, nitride, and carbon is 0.1% or less.

Figure 4:
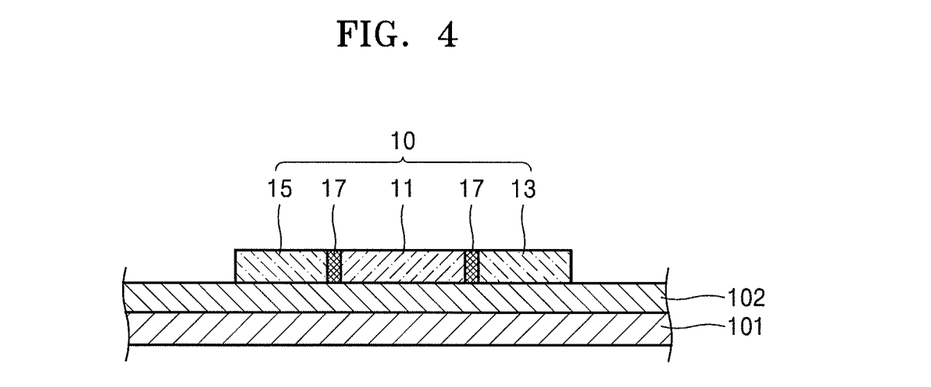
Figure 5:
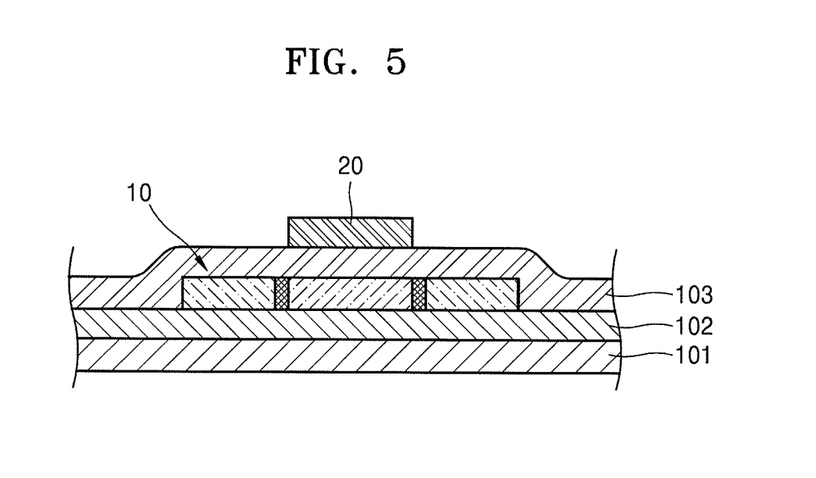

Thereafter, as shown in FIG. 4, the remaining crystallized silicon layer except for the active layer 10 may be removed, and as shown in FIG. 5, the gate insulating layer 103 and the gate electrode 20 may be formed. Although not shown, contact holes for respectively exposing the source and drain regions 13 and 15 may be formed in the gate insulating layer 103, wherein source and drain electrodes (not shown) may be respectively connected to the source and drain regions 13 and 15 through the contact holes.

Figure 6:
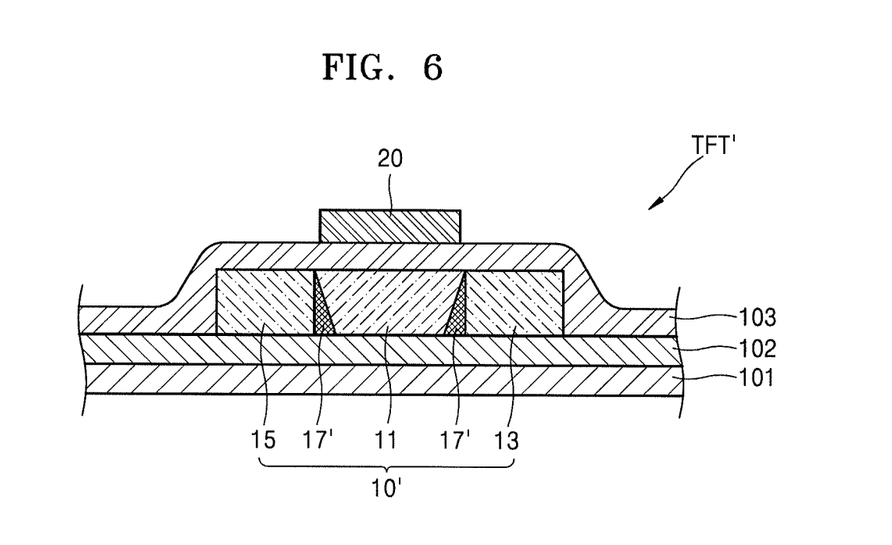
FIG. 6 illustrates a cross-sectional view of a modified example of the thin-film transistor of FIG. 1, according to an embodiment.

FIG. 6 illustrates a cross-sectional view of a modified example TFT' of the thin-film transistor TFT of FIG. 1, according to an embodiment, and FIGS. 7 to 10 illustrate cross-sectional views of a method of manufacturing the thin-film transistor TFT' of FIG. 6.

Referring to FIG. 6, the thin-film transistor TFT' according to an embodiment may include an active layer 10' formed on the substrate 101 and the gate electrode 20 formed on the active layer 10' by interposing the gate insulating layer 103 therebetween, and the active layer 10' may include the channel region 11, the source region 13, the drain region 15, and lightly doped regions 17'.

The substrate 101, the gate insulating layer 103, the channel region 11, the source region 13, and the drain region 15 are the same as described with reference to FIG. 1, and a description thereof is not repeated.

The lightly doped regions 17' may form an LDD structure of the thin-film transistor TFT'. Even though a width of the channel region 11 may decrease along with the miniaturization of the thin-film transistor TFT', the generation of hot carriers may be restrained, a leakage current may be reduced, and the reliability of the thin-film transistor TFT' may be improved.

A side surface of each of the lightly doped regions 17' that contacts the channel region 11 may be oblique, e.g., not perpendicular to a surface of the substrate 101. Other side surface of each of the lightly doped regions 17' that respectively contact the source and drain regions 13 and 15 may be almost vertical, e.g., perpendicular to the surface of the substrate 101, and horizontal cross-sectional areas of the lightly doped regions 17', e.g., cross-sectional areas of the lightly doped regions 17' in a direction parallel to the surface of the substrate 101, may be gradually reduced, e.g., may gradually decrease, in an upward direction, e.g., in a direction away from the substrate 101.

When the lightly doped regions 17' are formed obliquely towards the channel region 11, even though the gate electrode 20 disposed on the gate insulating layer 103 may be formed to overlap the lightly doped regions 17', a current leakage between the gate electrode 20 and the source region 13 and/or the drain region 15 may be prevented. The thin-film transistor TFT' may stably have a gate-overlapped-LDD (GOLD) structure, and the reliability of the thin-film transistor TFT' may be improved.

A method of manufacturing the thin-film transistor TFT' of FIG. 6 will now be described in brief with reference to FIGS. 7 to 10.

Figure 7:
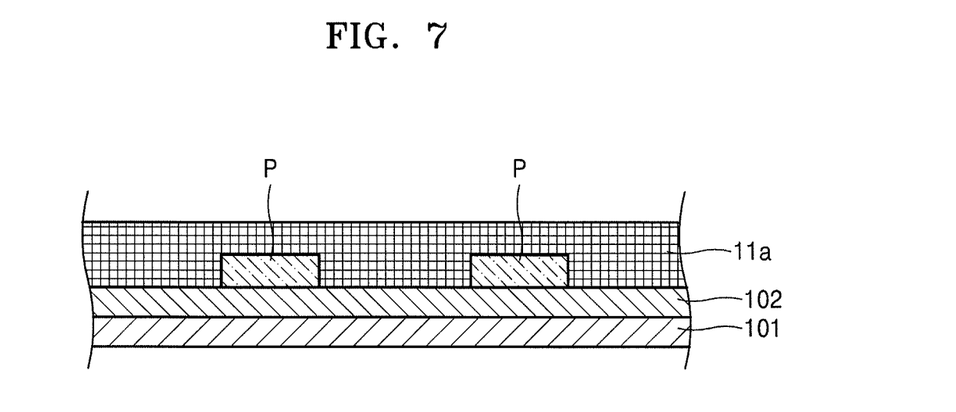
FIGS. 7 to 10 illustrate cross-sectional views of a method of manufacturing the thin-film transistor of FIG. 6.

As shown in FIG. 7, the amorphous silicon layer 11a and the one pair of precursor layers P may be formed on the substrate 101 on which the buffer layer 102 is formed. For example, after the one pair of precursor layers P are formed on the substrate 101 by a sputtering method, the amorphous silicon layer 11a may be formed so as to cover the one pair of precursor layers P.

A target used for sputtering may include the first and second elements, wherein a contained quantity of the second element may be less than that of the first element. For example, the target may have a composition of Ti-0.01% Cu, Ti-0.5% Zn, $Ti_{0.2}$—$Ni_{0.8}$, or Ni-0.001% Cu.

After forming the amorphous silicon layer 11a and the one pair of precursor layers P, the amorphous silicon layer 11a may be crystallized by annealing. During the annealing, the first and second elements included in the one pair of precursor layers P may be diffused into silicon, and the source region 13, the drain region 15, and the lightly doped regions 17' may be simultaneously formed.

Figure 8:
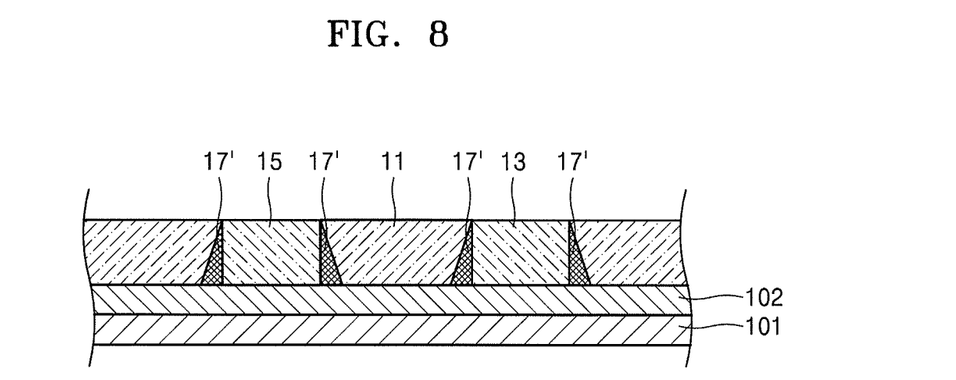

The second element may have a greater diffusion coefficient in silicon than the first element, the second element may be diffused to a wide area, e.g., to a wider area than the first element, and the lightly doped regions 17' may be formed at both sides of the source and drain regions 13 and 15, respectively. Since a diffusion direction of the second element is towards an upper part and side parts in silicon, as shown in FIG. 8, the other side surfaces of the lightly doped regions 17' respectively contacting the source and drain regions 13 and 15 may be formed in an almost vertical shape, and horizontal cross-sectional areas of the lightly doped regions 17' may be gradually reduced from the bottom to the top of the thin-film transistor TFT'. The lightly doped regions 17' may be formed obliquely towards the channel region 11.

The source and drain regions 13 and 15 may be formed of silicide including the first element, and the source and drain regions 13 and 15 may be formed by a low-temperature process in which an annealing temperature is lowered to about 500° C. or less.

Figure 9:
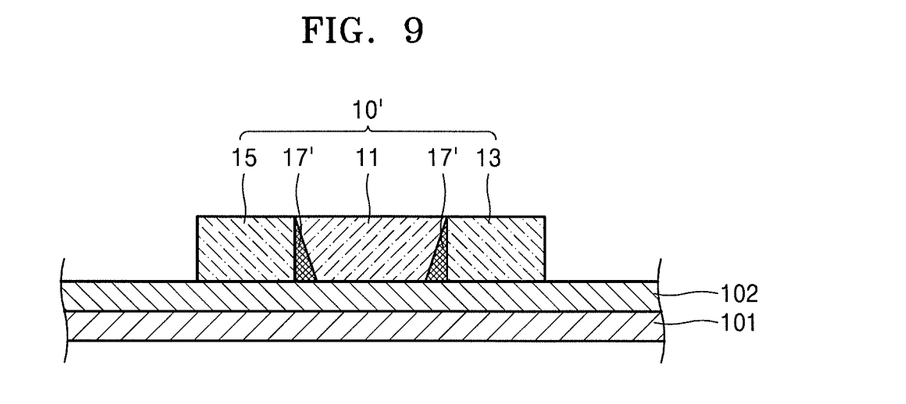
Figure 10:
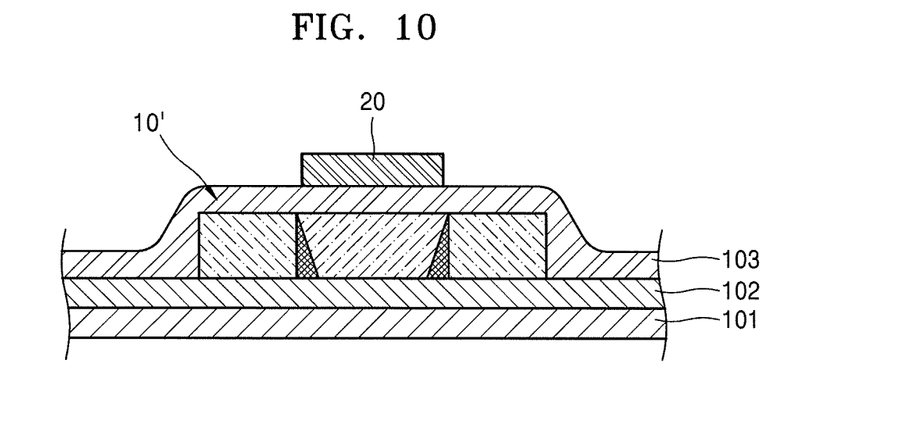

Thereafter, as shown in FIG. 9, the remaining crystallized silicon layer except for the active layer 10 may be removed, and as shown in FIG. 10, the gate insulating layer 103 and the gate electrode 20 may be formed. The gate electrode 20 may overlap the lightly doped regions 17', and a GOLD structure may be formed.

Although not shown, contact holes for respectively exposing the source and drain regions 13 and 15 may be formed in the gate insulating layer 103, wherein source and drain electrodes (not shown) may be respectively connected to the source and drain regions 13 and 15 through the contact holes.

Figure 11:
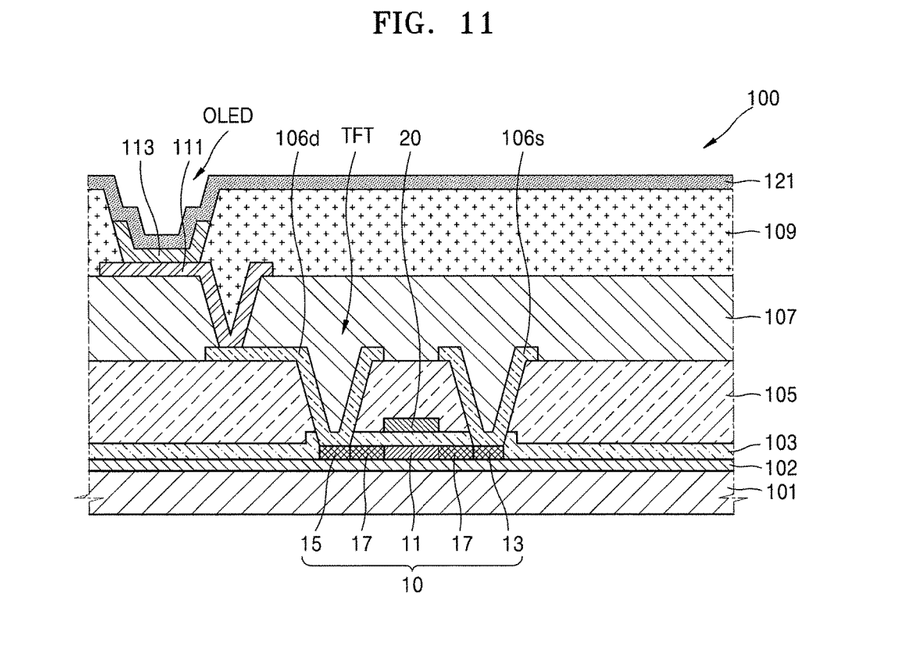
FIG. 11 illustrates a cross-sectional view of a portion of an organic light-emitting display device, according to an embodiment.

FIG. 11 illustrates a cross-sectional view of a portion of an organic light-emitting display device 100, according to an embodiment.

Referring to FIG. 11, the organic light-emitting display device 100 may include the substrate 101, at least one thin-film transistor TFT formed on the substrate 101, and an organic light-emitting diode OLED electrically connected to the thin-film transistor TFT.

The substrate 101 may be formed of a transparent glass material including $SiO_2$ as a main component. In an embodiment, the substrate 101 may use a substrate of various materials such as, for example, a transparent plastic material, or a metallic material.

The buffer layer 102 may be provided on an upper surface of the substrate 101, diffusion of impurity ions may be prevented, infiltration of moisture or external air may be prevented, and the surface may be planarized. The buffer layer 102 may include an inorganic material, such as, for example, silicon oxide, silicon nitride, silicon oxynitride, aluminum oxide, aluminum nitride, titanium oxide, or titanium nitride, or an organic material, such as, for example, polyimide, polyester, or acryl, and may be formed as a stacked body of multiple layers.

The thin-film transistor TFT may include the active layer 10, the gate electrode 20, a source electrode 106s, and a drain electrode 106d.

The active layer 10 may be formed of, for example, polysilicon and may include the channel region 11 and the source and drain regions 13 and 15 respectively disposed at both sides of the channel region 11 by interposing the channel region 11 therebetween. The active layer 10 may include the lightly doped regions 17 between the channel region 11 and the source region 13 and between the channel region 11 and the drain region 15.

The source and drain regions 13 and 15 may be formed of silicide doped with the first element. For example, the first element may include one or more of B, Ti, Ni, or Zn, a resistance and a leakage current of the source and drain regions 13 and 15 may be reduced, and a current characteristic of the thin-film transistor TFT may be improved.

The lightly doped regions 17 may be doped with the second element that is different from the first element. The second element may be a material of which a diffusion coefficient in silicon is greater than that of the first element. For example, the second element may include one or more of Ti, Ni, Zn, Fe, Cu, Au, or Ag. The lightly doped regions 17 may form an LDD structure of the thin-film transistor TFT. Even though a width of the channel region 11 may decrease along with the miniaturization of the thin-film transistor TFT, the generation of hot carriers may be restrained to improve a punch-through characteristic occurring, for example, due to a short-channel effect, and the reliability of the thin-film transistor TFT may be improved.

The gate insulating layer 103 may be disposed on the active layer 10. The gate insulating layer 103 may insulate between the active layer 10 and the gate electrode 20, e.g., may insulate the active layer 10 from the gate electrode 20, and may be formed of an organic material or an inorganic material such as $SiN_x$ or $SiO_2$.

The gate electrode 20 may include Au, Ag, Cu, Ni, Pt, Pd, Al, or Mo or an alloy such as an Al:Nd alloy or an Mo:W alloy. In an embodiment, the gate electrode 20 may be formed of various materials in consideration of design conditions.

An interlayer insulating layer 105 formed on the gate electrode 20 may insulate between the gate electrode 20 and the source electrode 106s, e.g., may insulate the gate electrode 20 from the source electrode 106s, and between the gate electrode 20 and the drain electrode 106d, e.g., may insulate the gate electrode 20 from the drain electrode 106d, and may be formed of an inorganic material such as $SiN_x$ or $SiO_2$.

The source electrode 106s and the drain electrode 106d may be formed on the interlayer insulating layer 105. The interlayer insulating layer 105 and the gate insulating layer 103 may be formed so as to expose the source and drain regions 13 and 15 of the active layer 10, and the source electrode 106s and the drain electrode 106d may be formed such that the source electrode 106s and the drain electrode 106d respectively contact the exposed source and drain regions 13 and 15 of the active layer 10.

In an embodiment, the organic light-emitting display device 100 of FIG. 11 may include the thin-film transistor TFT of FIG. 1. In an embodiment, the organic light-emitting display device 100 may include the thin-film transistor TFT' of FIG. 6.

The thin-film transistor TFT may be electrically connected to the organic light-emitting diode OLED to drive the organic light-emitting diode OLED and may be protected by being covered by a planarization layer 107.

The planarization layer 107 may use an inorganic insulating layer and/or an organic insulating layer. The inorganic insulating layer may include, for example, $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), or Lead Zirconate Titanate (PZT), and the organic insulating layer may include, for example, a general-use polymer (polymethyl methacrylate (PMMA) or polystyrene (PS)), polymer derivatives having a phenol-based group, an acrylic polymer, an imide-based polymer, an arylether-based polymer, an amide-based polymer, a fluorine polymer, a p-xylene-based polymer, a vinylalcohol-based polymer, or a blend thereof. In an embodiment, the planarization layer 107 may be formed as a composite stacked body of the inorganic insulating layer and the organic insulating layer.

The organic light-emitting diode OLED may be formed on the planarization layer 107, and the organic light-emitting diode OLED may include a pixel electrode 111, an intermediate layer 113, and an opposite electrode 121.

The pixel electrode 111 may be formed on the planarization layer 107 and may be electrically connected to the drain electrode 106d through a contact hole formed in the planarization layer 107.

The pixel electrode 111 may be, for example, a reflective electrode and may include a reflective layer formed of Ag, Mg, Al, Pt, Pd, Au, Ni, Nd, iridium (Ir), chromium (Cr), or a compound thereof and a transparent or translucent electrode layer formed on the reflective layer.

The transparent or translucent electrode layer may include one or more of indium tin oxide (ITO), indium zinc oxide (IZO), zinc oxide (ZnO), indium oxide ($In_2O_3$), indium gallium oxide (IGO), or aluminum zinc oxide (AZO).

The opposite electrode 121 disposed to face the pixel electrode 111 may be a transparent or translucent electrode and may be formed a metallic thin film having a low work function, which includes lithium (Li), calcium (Ca), lithium fluoride (LiF)/Al, Al, Ag, magnesium (Mg), and a compound thereof. An auxiliary electrode layer or a bus electrode may be further formed on the metallic thin film and of a transparent electrode formation material, such as, for example, ITO, IZO, ZnO, or $In_2O_3$.

The opposite electrode 121 may transmit therethrough light emitted from an organic emission layer (not shown) included in the intermediate layer 113. The light emitted from the organic emission layer may be emitted towards the opposite electrode 121 directly or by being reflected by the pixel electrode 111 including the reflective electrode.

The organic light-emitting display device 100 according to the present embodiment may be the front emission type. In an embodiment, the organic light-emitting display device 100 may be a rear emission type wherein the light emitted from the organic emission layer is emitted towards the substrate 101. The pixel electrode 111 may include a transparent or translucent electrode, and the opposite electrode 121 may include a reflective electrode. In an embodiment, the organic light-emitting display device 100 may be a both-sided emission type wherein light is emitted in both front and rear directions.

A pixel-defining layer 109 may be formed on the pixel electrode 111 and of an insulating material. The pixel-defining layer 109 may be formed of one or more organic insulating materials such as polyimide, polyamide, acrylic resin, benzocyclobutene, and phenol resin and by a method such as, for example, spin-coating. The pixel-defining layer 109 may expose a predetermined region of the pixel electrode 111, and the intermediate layer 113 including the organic emission layer may be located in the exposed region.

The organic emission layer included in the intermediate layer 113 may be a low- or high-molecular organic material, and besides the organic emission layer, the intermediate layer 113 may selectively further include function layers, such as, for example, a hole injection layer (HIL), a hole transport layer (HTL), an electron transport layer (ETL), and an electron injection layer (EIL).

By way of summation and review, an organic light-emitting display device may include at least one thin-film transistor, wherein the thin-film transistor may include an active layer, which may provide a channel region, a source region, and a drain region, and a gate electrode formed on the channel region and electrically insulated from the active layer by a gate insulating layer.

As described above, according to the one or more of the above exemplary embodiments, source and drain regions of a thin-film transistor may be formed of silicide, the thin-film transistor may have an LDD structure, and a current characteristic of the thin-film transistor may be improved.

By simultaneously forming the source and drain regions formed of silicide and the LDD structure, a process of manufacturing the thin-film transistor may be simplified.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin-film transistor, comprising:
   a substrate;
   an active layer on the substrate, wherein the active layer has a uniform thickness;
   a gate electrode on the active layer; and
   a gate insulating layer between the active layer and the gate electrode, wherein the active layer is crystallized and includes:
   a channel region;
   source and drain regions at opposite sides of the channel region; and
   lightly doped regions between the channel region and the source region and between the channel region and the drain region, the source and drain regions being doped with a first element, and the lightly doped regions being doped with a second element different from the first element,
   wherein cross-sectional areas of the lightly doped regions in a direction parallel to a surface of the substrate continuously decrease in a direction away from the substrate, the cross-sectional areas having pointed upper surfaces and vertical sidewalls.

2. The thin-film transistor as claimed in claim 1, wherein a diffusion coefficient of the second element with respect to silicon is greater than a diffusion coefficient of the first element with respect to silicon.

3. The thin-film transistor as claimed in claim 2, wherein the source and drain regions include silicide.

4. The thin-film transistor as claimed in claim 3, wherein the first element includes one or more of boron (B), titanium (Ti), nickel (Ni), or zinc (Zn).

5. The thin-film transistor as claimed in claim 2, wherein the second element includes one or more of titanium (Ti), nickel (Ni), or zinc (Zn), iron (Fe), copper (Cu), gold (Au), or silver (Ag).

6. The thin-film transistor as claimed in claim 5, wherein side surfaces of the lightly doped regions contacting the channel region are not perpendicular to the surface of the substrate.

7. The thin-film transistor as claimed in claim 1, wherein each one of the lightly doped regions includes a first side surface contacting the source and drain regions and a second side surface contacting the channel region, the first side surfaces being the vertical sidewalls that are perpendicular to the surface of the substrate, and the second side surfaces intersecting with the first side surfaces to define sharp points at the pointed upper surfaces.

8. The thin-film transistor as claimed in claim 7, wherein the gate electrode overlaps the lightly doped regions.

9. A method of manufacturing a thin-film transistor, the method comprising:
   forming one pair of precursor layers and an amorphous silicon layer on a substrate;
   forming an active layer by crystallizing the amorphous silicon layer, wherein the active layer has a uniform thickness;
   forming a gate insulating layer on the active layer; and
   forming a gate electrode on the gate insulating layer,
   wherein the one pair of precursor layers includes first and second elements that are different from each other, and
   wherein forming the active layer includes:
   forming a channel region by crystallizing the amorphous silicon layer;
   forming source and drain regions by diffusing the first element into the amorphous silicon layer during crystallization of the amorphous silicon layer; and
   forming lightly doped regions by diffusing the second element into the amorphous silicon layer during crystallization of the amorphous silicon layer, such that cross-sectional areas of the lightly doped regions in a direction parallel to a surface of the substrate continuously decrease in a direction away from the substrate, the cross-sectional areas having pointed upper surfaces and vertical sidewalls.

10. The method as claimed in claim 9, wherein:
    the second element is diffused to a wider area than the first element in the amorphous silicon layer,
    the source and drain regions are formed at opposite sides of the channel region, and
    the lightly doped regions are formed between the channel region and the source region and between the channel region and the drain region.

11. The method as claimed in claim 10, wherein:
    forming the one pair of precursor layers is performed after forming the amorphous silicon layer, and
    the one pair of precursor layers are formed on the amorphous silicon layer at locations corresponding to where the source and drain regions are to be formed.

12. The method as claimed in claim 10, wherein the source and drain regions include silicide.

13. The method as claimed in claim 10, wherein:
    forming the amorphous silicon layer is performed after forming the one pair of precursor layers, and
    the amorphous silicon layer covers the one pair of precursor layers.

14. The method as claimed in claim 13, wherein:
    side surfaces of the lightly doped regions contacting the channel region are not perpendicular to the surface of the substrate, and
    side surfaces of the lightly doped regions contacting the source and drain regions are the vertical sidewalls that are perpendicular to the surface of the substrate.

15. The method as claimed in claim 14, wherein the gate electrode overlaps the lightly doped regions.

16. The method as claimed in claim 9, wherein forming the one pair of precursor layers is performed by a sputtering method using a target including the first and second elements.

17. The method as claimed in claim 16, wherein an amount of the first element in the target is greater than an amount of the second element in the target.

18. An organic light-emitting display device, comprising:
    a substrate;
    a thin-film transistor on the substrate; and
    an organic light-emitting diode electrically connected to the thin-film transistor, the thin-film transistor including:
    an active layer on the substrate, wherein the active layer has a uniform thickness;
    a gate electrode on the active layer; and
    a gate insulating layer between the active layer and the gate electrode, wherein the active layer is crystallized and includes:
    a channel region;
    source and drain regions at opposite sides of the channel region; and
    lightly doped regions between the channel region and the source region and between the channel region and the drain region, the source and drain regions being doped with a first element, and the lightly doped regions being doped with a second element different from the first element,
    wherein cross-sectional areas of the lightly doped regions in a direction parallel to a surface of the substrate continuously decrease in a direction away from the substrate, the cross-sectional areas having pointed upper surfaces and vertical sidewalls.

19. The organic light-emitting display device as claimed in claim 18, wherein the source and drain regions include silicide.

20. The organic light-emitting display device as claimed in claim 18, wherein the gate electrode overlaps the lightly doped regions.

* * * * *